United States Patent [19]

Yamoto et al.

[11] Patent Number: 4,702,937
[45] Date of Patent: Oct. 27, 1987

[54] METHOD FOR MANUFACTURING A SEMICONDUCTOR DEVICE

[75] Inventors: Hisayoshi Yamoto; Hideo Suzuki, both of Kanagawa, Japan

[73] Assignee: Sony Corporation, Tokyo, Japan

[21] Appl. No.: 804,092

[22] Filed: Dec. 3, 1985

[30] Foreign Application Priority Data

Dec. 4, 1984 [JP] Japan .............................. 59-256274

[51] Int. Cl.$^4$ ........................................ H01L 21/285
[52] U.S. Cl. ................................... 437/233; 427/102; 437/234
[58] Field of Search ................. 427/102, 86, 93, 95

[56] References Cited

U.S. PATENT DOCUMENTS 4,087,571  5/1978  Kamins ............................... 427/86
4,489,103  12/1984  Goodman ........................... 427/86

Primary Examiner—John D. Smith
Attorney, Agent, or Firm—Hill, Van Santen, Steadman & Simpson

[57] ABSTRACT

The invention relates to a method for manufacturing a semiconductor device with a resistor having a high resistance.

In the invention, a first polycrystalline silicon layer is first formed to connect with an electrically connecting portion formed in a semiconductor substrate. Next, a second polycrystalline silicon layer containing oxygen is formed on the first polycrystalline silicon layer. And then, an oxide formed between the two polycrystalline silicon layer is removed by annealing.

15 Claims, 9 Drawing Figures

METHOD FOR MANUFACTURING A SEMICONDUCTOR DEVICE

BACKGROUND OF THE INVENTION

1. Field of the Invention

The present invention relates to a method for manufacturing a semiconductor device having a semiconductor substrate and a resistor electrically connected to the substrate.

2. Description of the Prior Art

FIG. 3 shows a circuit diagram of a resistor load-type SRAM as a semiconductor device of the type described above. An SRAM 11 shown in FIG. 3 consists of FETs 12 and resistors 13.

FIG. 1 shows a sectional view of a first conventional example of the SRAM 11. In this example, an $SiO_2$ layer 15 is formed on an Si substrate 14. A diffusion region 17 is formed on an Si substrate 14. A diffusion region 17 is formed in the substrate 14 by diffusion through an opening 16. formed in the $SiO_2$ layer 15. The diffusion region 17 acts as the drain for the FET 12. A polycrystalline Si layer 18 is formed to cover the diffusion region 17 and the $SiO_2$ layer 15. The polycrystalline Si layer 18 acts as the resistor 13.

The stand-by current of the SRAM 11 is determined by the resistance of the resistor 13. In the above conventional example, the polycrystalline Si layer 18 serving as the resistor 13 has a relatively low resistivity of $5\times10^5$ $\Omega$.cm. Therefore, the stand-by current of the SRAM 11 is relatively high, and power consumption is high. These problems become particularly noticeable when a number of SRAMs 11 are integrated.

FIG. 2 shows a second conventional example of the SRAM 11 as an improvement over the first example. The SRAM 11 of this example is substantially the same as that of the first example example except that a polycrystalline Si layer 19 containing oxygen is used in place of the pure polycrystalline Si layer 18.

As disclosed in issued Japanese Pat. No. 13426/80, a polycrystalline Si containing oxygen has a very high resistivity: about $2\times10^6$ $\Omega$· cm at an oxygen content of 2% and about $10^{10}$ $\Omega$· cm at an oxygen content of 20%. A semiconductor device having a layer of such a polycrystalline Si containing oxygen formed on a semiconductor substrate is also described in issued Japanese Pat. No. 2552/78.

The polycrystalline Si layer 19 containing oxygen is formed by a low-pressure CVD method using, for example, $SiH_4$ (flow rate: 50 cc/min), $N_2O$ (flow rate: 2 cc/min), and $N_2$ or He as needed. In this case, in order to stabilize the $N_2O$ flow rate, only $N_2$ is supplied for 1 to 2 minutes before $SiH_4$ is supplied. Therefore, the Si substrate 14 is oxidized, and a thin $SiO_2$ layer 20 is formed between the diffusion region 17 and the polycrystalline Si layer 19 containing oxygen.

When P or As is doped in a connection portion between the diffusion region 17 and the polycrystalline Si layer 19 in order to reduce the connection resistance of this connecting portion, the $SiO_2$ layer 20 becomes PSG or AsSG. Even if annealing is formed, the $SiO_2$ layer 20 remains unchanged. Therefore, it is very difficult to ohmically connect the diffusion region 17 and the polycrystalline Si layer 19.

As can thus be seen, it is difficult to obtain a sufficiently high resistance with the pure polycrystalline Si layer 18 while it is also difficult to ohmically connect the polycrystalline Si layer 19 and the diffusion region 17 with the polycrystalline Si layer 19 containing oxygen.

SUMMARY OF THE INVENTION

A method for manufacturing a semiconductor device according to the present invention comprises the steps of forming a first polycrystalline silicon layer over at least an electrically connecting portion formed in a semiconductor substrate, forming a second polycrystalline silicon layer containing oxygen on the first polycrystalline silicon layer, and annealing the semiconductor substrate on which the first and second polycrystalline silicon layers are formed.

According to the method for manufacturing a semiconductor device according to the present invention, the second polycrystalline silicon layer, containing oxygen, is formed on the first polycrystalline silicon layer, and the structure is annealed. In this way, an oxide formed between the first and second layers upon formation of the second layer, which contains oxygen, is dispersed over the first and second polycrystalline layers.

In the method for manufacturing a semiconductor device according to the present invention, then, an oxide formed between the first and second polycrystalline silicon layers upon formation of the second polycrystalline silicon layer containing oxygen is dispersed over the first and second polycrystalline silicon layers, thereby ohmically connecting the electrically connecting portion of the semiconductor substrate and the second polycrystalline silicon layer. In addition, a high resistance can be obtained by the second polycrystalline silicon layer.

DETAILED DESCRIPTION OF THE PREFERRED EMBODIMENTS

The first and second embodiments of the present invention as applied to the manufacture of an SRAM will be described with refrence to FIGS. 4 and 5.

Figure 4A:
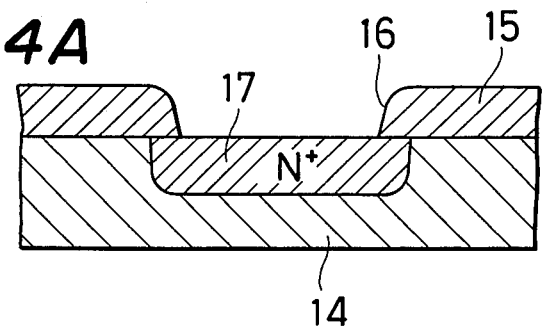
FIG. 4 is a sectional view showing steps in a first embodiment of the present invention.

FIGS. 4a to 4E show the first embodiment of the present invention. In the first embodiment, as shown in FIG. 4A, an $SiO_2$ layer 15 is formed on an Si substrate 14. A diffusion region 17 is formed in the substrate 14 by diffusion through an opening 16 formed in the $SiO_{12}$ layer 15.

Figure 1:
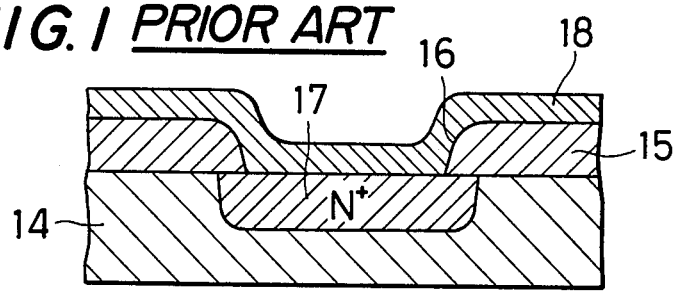
FIG. 1 is a sectional view showing a first conventional example.
Figure 2:
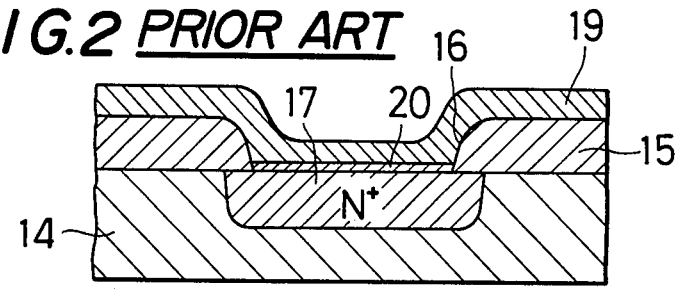
FIG. 2 is a sectional view showing a second conventional example.
Figure 3:
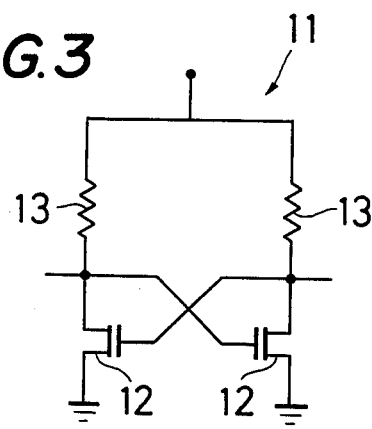
FIG. 3 is a circuit diagram showing an SRAM to which the present invention can be applied.
Figure 4B:
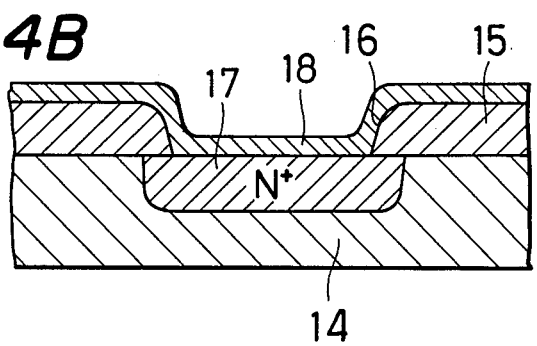

Subsequently, as shown in FIG. 4b, a polycrystalline Si layer 18 having a thickness of 50 to 200 Å is formed by the low-pressure CVD method on the diffusion region 17 and the $SiO_2$ layer 15 as in the prior art embodiment shown in FIG. 1. Since a gas containing oxygen is not used in this step, an $SiO_2$ layer is not formed between the diffusion region 17 and the polycrystalline Si layer 18 as in the case of layer 20 of the second conventional example.

Figure 4C:
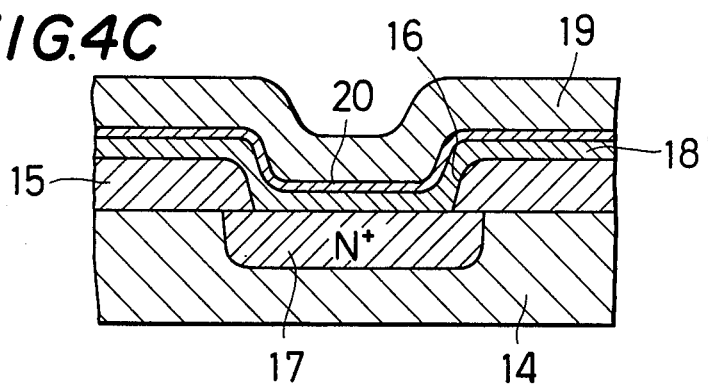

As shown in FIG. 4c, a polycrystalline Si layer 19 containing 2 to 10 atomic % of oxygen and having a thickness of 1,500 to 4,000 Å is formed by the low-pressure CVD method on the polycrystalline Si layer 18. In this process, as in the case of the second conventional example, the polycrystalline Si layer 18 is oxidized, and an $SiO_2$ layer 20 having a thickness of about 10 to 30 Å is formed between the first and second Si layers 18 and 19.

Figure 4D:
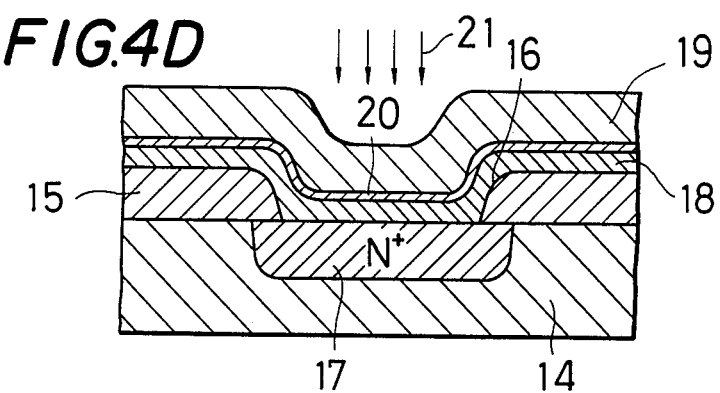

As shown in FIG. 4D, in order to reduce the connecting resistance between the diffusion region 17 and the polycrystalline Si layer 18, P or As ions 21 are ion-implanted in the connecting portion at a dose of $1 \times 10^{16} cm^{-2}$ and an acceleration energy of 70 keV.

Figure 4E:
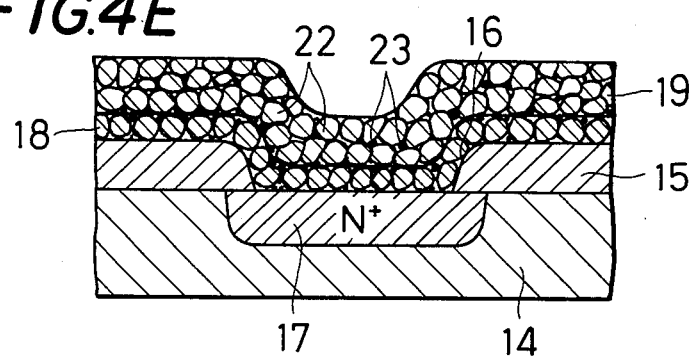

The Si substrate 14 on which the polycrystalline Si layers 18 and 19 are formed is annealed in an $N_2$ atmosphere at 900 to 1,000,C for 20 to 60 minutes. Then, as shown in FIG. 4e, the Si crystal grains of the polycrystalline Si layers 18 and 19, which had sizes of 20 to 50 Å, grow into Si crystal grains 22 having sizes of about 200 Å. The $SiO_2$ layer 20, which has been sandwiched between the polycrystalline Si layers 18 and 19, is formed into $SiO_2$ masses 23 that are dispersed between the Si crystal grains 22.

As a result, as shown in FIG. 4E, the $SiO_2$ layer 20 disappears. The polycrystalline Si layers 18 and 19 are ohmically connected and thus the polycrystalline Si layers 19 and the diffusion region 17 are also ohmically connected.

When the SRAM 11 is manufactured according to this embodiment, a resistor 13 having a resistance several times to several hundred times that of the first conventional example, using only the polycrystalline Si layer 18, can be formed. The stand-by current can be reduced to from 1/n to 1/100n (where n is a positive integer smaller than 10.)

Furthermore, $SiO_2$ layer does not remain as in the case of the second conventional example. Therefore, the resistor 13 and the drain of the FET 12 can be ohmically connected.

Growth of crystal grains as described above is also described in M. Hamasaki et al. "Crystal Graphic Study of Semiinsulating Poly Crystallize Silicon (SIPOS) Doped With Oxygen Atoms", J.A.P. 49 (7), July 1978 pp 3987-3982, and T. Adachi et al., "AES and PES studies of Semi-Insulating Polycrystallize Silicon (SIPOS) Films", J.E. CS Fol. 127, No. 7, July 1980, PP 1617-1621.

Figure 5:
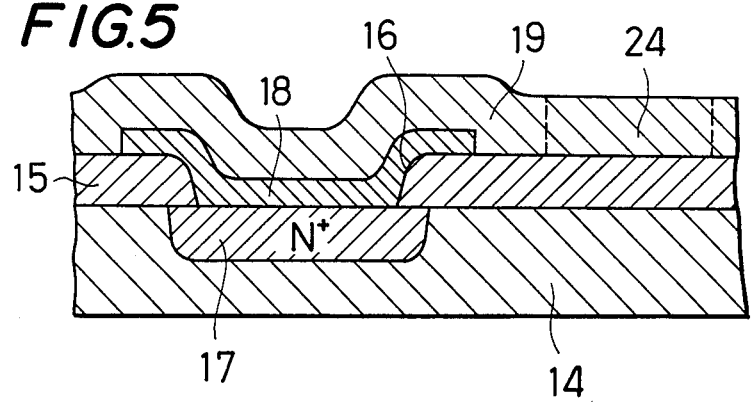
FIG. 5 is a sectional view showing a step in a second embodiment of the present invention corresponding to that shown in FIG. 4E.

FIG. 5 shows a second embodiment of the present invention and corresponds to FIG. 4E of the first embodiment. The second embodiment has substgantially the same steps as those of the first embodiment except that the polycrystalline Si layer 18 is formed not on the entire surfaces of the diffusion region 17 and the $SiO_2$ layer 15 but only on the diffusion region 17 and the portion of the $SiO_2$ layer 15 near the region 17.

In the SRAM 11, the polycrystalline Si layer 19 is used as a resistor in a direction along the surface of the Si substrate 14. However, when the polycrystalline Si layer 18 is formed on the entire surface of the Si substrate 14 as shown in FIG. 14e, a current also flows in the polycrystaliine Si layer 18.

Since the polycrystalline Si layer 18 has a lower resistivity than that of the polycrystalline Si layer 19, the layer 18 must be made extremely thin as compared with the layer 19 in order to obtain a high overall resistance. However, it is not easy to form a very thin polycrystalline Si layer 18, and product reliability also suffers when such a thin layer is used.

As in this embodiment, however, if the polycrystalline Si layer 18 is formed only near the diffusion region 17 to be in ohmic contact with the polycrystalline Si layer 19, a resistor portion 24 in the polycrystalline Si layer 19 serving as a resistor 13 of the SRAM 11 has a high resistance. Therefore, since the polycrystalline Si layer 18 can be formed to have a thickness of 1,000 to 2,000 Å larger than in the first embodiment, the layer 18 can be formed easily and product reliability is improved.

In the first and second embodiments, the present invention is applied to the manufacture of SRAMs. However, the present invention can also be applied to the manufacture of devices other than SRAMs and it is our intent that the scope of the invention be limited only by that of the appended claims.

We claim as our invention:

1. The method of manufacturing a semiconductor device incorporating a polycrystalline layer containing oxygen, comprising the steps of: forming a first polycrystalline silicon layer over at least an electrically connecting portion formed in a semiconductor substrate; forming a second polycrystalline silicon layer, containing oxygen, on said first polycrystalline silicon layer and thereby forming a layer of silicon dioxide between the first and second layers; and annealing said semiconductor substrate on which said first and second polycrystalline silicon layers are formed thereby converting the silicon dioxide layer into discontinuous $SiO_2$ masses and substantially ohmically connecting said first and second layers.

2. A method according to claim 1, wherein said electrically connecting portion is an impurity diffusion region formed in said semiconductor substrate.

3. A method according to claim 1, wherein said first and second polycrystalline silicon layers are formed over generally the region of said semiconductor substrate, 4. A method according to claim 1, wherein said first polycrystalline silicon layer is formed in a limited area only near said electrically connecting portion.

5. A method according to claim 4, wherein said first polycrystalline silicon layer has a thickness of 1,000 to 2,000 Å.

6. A method according to claim 5, wherein said second polycrystalline silicon layer contains 2 to 10 atomic % of oxygen and is larger in area than said first layer.

7. A method according to claim 6, wherein the annealing step is performed in a nitrogen atmosphere at 900° to 1,000° C. for 20 to 60 minutes.

8. A method according to claim 1, wherein said first polycrystalline silicon layer has a thickness of 50 to 200 Å, and said second polycrystalline silicon layer has a thickness of 1,500 to 4,000 Å.

9. A method according to claim 8, wherein said second polycrystalline silicon layer contains 2 to 10 atomic % of oxygen.

10. A method according to claim 9, wherein the annealing step is performed in a nitrogen atmosphere at 900° to 1,000° C. for 20 to 60 minutes.

11. A method according to claim 1, wherein the annealing step is performed in a nitrogen atmosphere at 900° to 1,000° C. for 20 to 60 minutes.

12. A method according to claim 1, wherein said first and second polycrystalline silicon layers serve as a resistor of an SRAM.

13. A method according to claim 12, wherein said electrically connecting portion is a drain region of an FET of said SRAM.

14. A method according to claim 1, wherein said second polycrystalline silicon layer contains 2 to 10 atomic 5 of oxygen.

15. The method of manufacturing a semiconductor device comprising the steps of: forming a first polycrystalline silicon layer over at least an electrically connecting portion formed in a semiconductor substrate; forming a second polycrystalline silicon layer, containing oxygen, on said first polycrystalline silicon layer, and thereby providing a thin layer of $SiO_2$ between said first and second layer; and annealing said semiconductor substrate on which said first and second polycrystalline silicon layers are formed, causing silicon crystalline growth in said first and second layers dispersing the $SiO_2$ of said thin layer to substantially ohmically connect said layers.

* * * * *